(12) United States Patent
Lunsman et al.

(10) Patent No.: US 12,313,089 B2
(45) Date of Patent: May 27, 2025

(54) COOL FLUID RESERVOIR FOR A COOLANT DISTRIBUTION UNIT

(71) Applicant: HEWLETT PACKARD ENTERPRISE DEVELOPMENT LP, Houston, TX (US)

(72) Inventors: Harvey J. Lunsman, Chippewa Falls, WI (US); Michael Scott, Chippewa Falls, WI (US); David Collins, Chippewa Falls, WI (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 303 days.

(21) Appl. No.: 17/708,240

(22) Filed: Mar. 30, 2022

(65) Prior Publication Data
US 2023/0320031 A1 Oct. 5, 2023

(51) Int. Cl.
| F15B 1/24 | (2006.01) |
| F15B 1/02 | (2006.01) |
| F15B 21/00 | (2006.01) |
| F16L 55/052 | (2006.01) |
| F16L 55/053 | (2006.01) |

(52) U.S. Cl.
CPC .............. *F15B 1/24* (2013.01); *F15B 1/021* (2013.01); *F15B 1/025* (2013.01); *F15B 21/006* (2013.01); *F15B 2201/31* (2013.01); *F15B 2201/32* (2013.01); *F15B 2201/413* (2013.01); *F16L 55/052* (2013.01); *F16L 55/053* (2013.01)

(58) Field of Classification Search
CPC .......... F15B 1/021; F15B 1/025; F15B 1/027; F15B 1/033; F15B 1/24; F15B 21/006; F15B 2201/31; F15B 2201/32; F15B 2201/413; F16L 55/052; F16L 55/053
USPC ......................................... 138/31
See application file for complete search history.

(56) References Cited

U.S. PATENT DOCUMENTS

| 742,511 | A | * | 10/1903 | Stebbins | .................. E03B 7/10 138/27 |
| 4,644,976 | A | * | 2/1987 | Peter | ......................... F15B 1/24 73/239 |
| 6,070,408 | A | * | 6/2000 | Clarke | .................... F15B 1/033 60/415 |
| 7,739,941 | B2 | | 6/2010 | Noble et al. | |

(Continued)

FOREIGN PATENT DOCUMENTS

| CN | 204851842 | 12/2015 | |
| GB | 2009872 A | * 6/1976 | ............. F16L 27/12 |

*Primary Examiner* — Matthew Wiblin
(74) *Attorney, Agent, or Firm* — Hewlett Packard Enterprise Patent Department (57) ABSTRACT

Example implementations relate to a cool fluid reservoir for managing loss of cool fluid in a coolant distribution unit (CDU). The cool fluid reservoir includes a cylinder which has an internal volume defined between an inlet and outlet, and a hollow piston that is slidably connected to the cylinder via one of the inlet or outlet to split the internal volume into a first volume portion filled with the cool fluid and a second volume portion filled with driver fluid. The first volume portion is fluidically connected to a closed fluid loop of the CDU via the hollow piston and other one of the inlet or outlet. The hollow piston is slidably driven by the driver fluid to reduce the first volume portion and inject a portion of the cool fluid from the first volume portion into the closed fluid loop based on an operating pressure of the cool fluid.

20 Claims, 8 Drawing Sheets

(56) References Cited

U.S. PATENT DOCUMENTS

| | | | |
|---|---|---|---|
| 2015/0020511 A1* | 1/2015 | Hand | E02F 9/2296 |
| | | | 60/327 |
| 2015/0167698 A1* | 6/2015 | Condon | F15B 1/24 |
| | | | 138/31 |
| 2020/0407946 A1* | 12/2020 | Kondo | F15B 21/14 |
| 2021/0276738 A1* | 9/2021 | Kim | B64G 1/58 |
| 2022/0057123 A1* | 2/2022 | Tokeshi | F04B 23/02 |
| 2023/0341072 A1* | 10/2023 | Soder | F16L 55/053 |

* cited by examiner

COOL FLUID RESERVOIR FOR A COOLANT DISTRIBUTION UNIT

CROSS REFERENCE

This application is related to a co-pending U.S. application titled "Accumulator for a coolant distribution unit" filed on "Mar. 30, 2022" (U.S. Application Serial Number to be determined), which has Invention Reference Number "P168776 US", and is assigned to Hewlett Packard Enterprise Development LP.

BACKGROUND

Data center environments may include electronic systems, such as server systems, storage systems, wireless access points, network switches, routers, or the like. Each electronic system may include electronic components that operate optimally within a temperature range. During the operation of such electronic systems, the electronic components may generate waste-heat. Accordingly, each electronic system may have to be cooled to maintain the electronic components within the temperature range. For example, a coolant distribution unit (CDU) of the data center environment may circulate a cool fluid into a closed fluid loop to dissipate the waste-heat generated from the electronic components of each electronic system and maintain the electronic components within the temperature range. The CDU may tend to lose some portion of the cool fluid over some time due to leakages. Accordingly, a fluid reservoir having a stored volume of the cool fluid may be connected to the CDU for adding stored cool fluid into the CDU to make up the loss of the cool fluid.

BRIEF DESCRIPTION OF THE DRAWINGS

Various examples will be described below with reference to the following figures.

DETAILED DESCRIPTION

The following detailed description refers to the accompanying drawings. Wherever possible, the same reference numbers are used in the drawings and the following description to refer to the same or similar parts. It is to be expressly understood, however, that the drawings are for the purpose of illustration and description only. While several examples are described in this document, modifications, adaptations, and other implementations are possible. Accordingly, the following detailed description does not limit the disclosed examples. Instead, the proper scope of the disclosed examples may be defined by the appended claims.

The terminology used herein is for the purpose of describing examples only and is not intended to be limiting. As used herein, the singular forms "a," "an," and "the" are intended to include the plural forms as well, unless the context indicates otherwise. The term "plurality," as used herein, is defined as two, or more than two. The term "another," as used herein, is defined as at least a second or more. The term "coupled," as used herein, is defined as connected, whether directly without any intervening elements or indirectly with at least one intervening element, unless otherwise indicated. Two elements may be coupled mechanically, electrically, or communicatively linked through a communication channel, pathway, network, or system. The term "and/or" as used herein refers to and encompasses any and all possible combinations of one or more of the associated listed items. It will also be understood that, although the terms first, second, third, etc. may be used herein to describe various elements, these elements should not be limited by these terms, as these terms are only used to distinguish one element from another unless stated otherwise or the context indicates otherwise. As used herein, the term "includes" means includes but not limited to, the term "including" means including but not limited to. The term "based on" means based at least in part on.

For purposes of explanation, certain examples are described with reference to the components or elements illustrated in FIGS. 1-5. The functionality of the illustrated components or elements may overlap, however, and may be present in a fewer or greater number of elements or components. Further, all or part of the functionality of illustrated elements may co-exist or be distributed among several geographically dispersed locations. Moreover, the disclosed examples may be implemented in various environments and are not limited to the illustrated examples. Further, the sequence of operations performed for adding a cool fluid into a coolant distribution unit described in connection with FIG. 5, is an example and is not intended to be limiting. Additional or fewer operations or combinations of operations may be used or may vary without departing from the scope of the disclosed examples. Thus, the present disclosure merely sets forth possible examples of implementations, and many variations and modifications may be made to the described examples. Such modifications and variations are intended to be included within the scope of this disclosure and protected by the following claims.

A data center environment may include electronics systems for executing one or more customer workloads and a CDU for thermal management of the electronic systems. Examples of electronic systems may include, but are not limited to, server systems, storage systems, wireless access points, network switches, or the like. During the operation of the electronic systems, the electronic systems executing workloads may generate waste heat. The CDU may circulate cool fluid to the electronic systems via a closed fluid loop to dissipate the waste-heat. For example, the closed fluid loop may direct the cool fluid through cooling components, such as cold plates disposed in thermal contact with electronic components of each electronic system, to transfer the waste-heat from a respective electronic component to the cool fluid. Examples of the electronic components may include, but are not limited to, central processing units (CPUs), graphics processing units (GPUs), power supply units, memory chips, or other electronic elements, such as capacitors, inductors, resistors, or the like. However, the CDU may tend to lose some portion of the cool fluid over time due to evaporation within the closed fluid loop and/or dripping from one or more plumbing joints in the CDU. Accordingly, such loss of the cool fluid may gradually decrease an operating pressure of the cool fluid in the closed fluid loop. When the operating pressure drops below a threshold pressure of the closed fluid loop, it can cause cavitation of circulation pumps, resulting in pump damage. Further, cavitation may also occur at certain pressure points in the plumbing, resulting in damage to the plumbing, thereby leading to a premature CDU failure.

One solution to address such issues may include adding some portion of the cool fluid into the closed fluid loop when the operating pressure drops below a threshold pressure to return the pressure levels to the operating pressure. To accomplish that, a fluid reservoir having a stored volume of the cool fluid may be fluidically connected to the closed fluid loop to inject some portion of the stored cool fluid into the closed fluid loop. However, the stored cool fluid may be stagnant in the fluid reservoir for long periods. Chemicals in the stagnant cool fluid may degrade and/or may come out of (or release from) the stored cool fluid. Hence, the stored cool fluid may degrade such that it no longer maintains certain properties, such as corrosion and biological growth inhibition properties. Such properties are essential to minimize degradation of the closed fluid loop. As a result, when some portion of such stored cool fluid is added into the closed fluid loop, it may inadvertently introduce bacteria and/or corrosive particles into the closed fluid loop, thereby contaminating the whole mixture of the cool fluid in the closed fluid loop. Thus, the electronic systems may be forced to undergo avoidable shutdown for contaminated cool fluid replacement.

A technical solution to the aforementioned problems may include providing a cool fluid reservoir having an internal volume filled with a cool fluid positioned in a cool fluid flow path defined by a closed fluid loop to allow a continuous flow of the cool fluid into the closed fluid loop via the internal volume of the cool fluid reservoir. Since the cool fluid filled in the internal volume of the cool fluid reservoir flows continuously, stagnation of the cool fluid reservoir may be avoided. Accordingly, the cool fluid reservoir of the present disclosure may overcome one or more problems associated with the stagnation of the cool fluid stored in the existing fluid reservoir. Further, the cool fluid reservoir may be actuated (e.g., pushed to slide), when an operating pressure drops below a threshold pressure. This reduces the internal volume and injects a portion of the cool fluid from its internal volume into the closed fluid loop to return pressure levels to the operating pressure. Thus, the cool fluid reservoir may additionally prevent the problems associated with cavitation of circulation pumps and plumbing in a CDU.

In some examples, the cool fluid reservoir includes a cylinder having an internal volume defined between an inlet and an outlet, and a hollow piston slidably connected to the cylinder via one of the inlet or the outlet. In such examples, the hollow piston and other one of the inlet or the outlet is fluidically connected to the cool fluid flow path of the closed fluid loop to allow the continuous flow of the cool fluid through the cool fluid reservoir. Thus, the cool fluid reservoir ensures that there is no stagnation of the cool fluid in its internal volume. Further, the hollow piston may be pushed to slide within the cylinder to reduce the internal volume of the cylinder. This injects a portion of the cool fluid that is filled in its internal volume into the closed fluid loop. Thus, the cool fluid reservoir ensures that the cool fluid injected into the closed fluid loop has the same chemistry as the rest of the cool fluid in the closed fluid loop. Accordingly, the cool fluid reservoir of the present disclosure may overcome one or more problems related to stagnation of the cool fluid and simultaneously manages the loss of the cool fluid in the CDU to maintain an operating pressure of the cool fluid in the closed fluid loop.

Accordingly, the present disclosure describes example implementations of a cool fluid reservoir for managing a loss of cool fluid in a CDU. The cool fluid reservoir includes a cylinder and a hollow piston. The cylinder has an internal volume defined between an inlet and an outlet. The hollow piston is slidably connected to the cylinder via one of the inlet or the outlet to split the internal volume into a first volume portion that is filled with the cool fluid and a second volume portion that is filled with a driver fluid. The first volume portion is fluidically connected to the closed fluid loop via the hollow piston and other one of the inlet or the outlet of the cylinder to allow a continuous flow of the cool fluid via the first volume portion of the cool fluid reservoir. Further, the hollow piston is slidably driven by the driver fluid to reduce the first volume portion and inject a portion of the cool fluid from the first volume portion into the closed fluid loop based on an operating pressure of the cool fluid in the closed fluid loop.

Figure 1A:
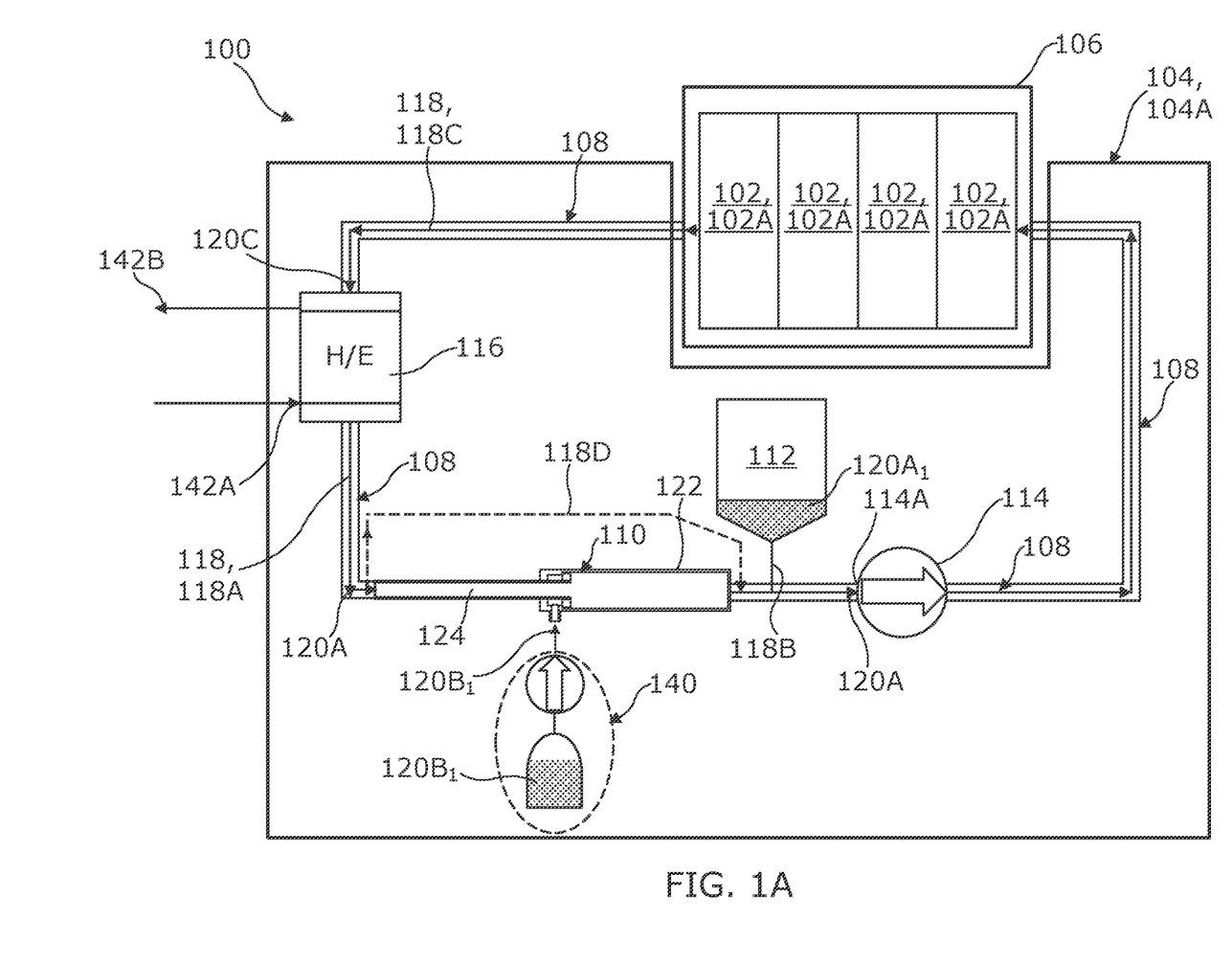
FIG. 1A illustrates a block diagram of a data center environment having a coolant distribution unit and a plurality of electronic systems according to an example implementation of the present disclosure.
Figure 1B:
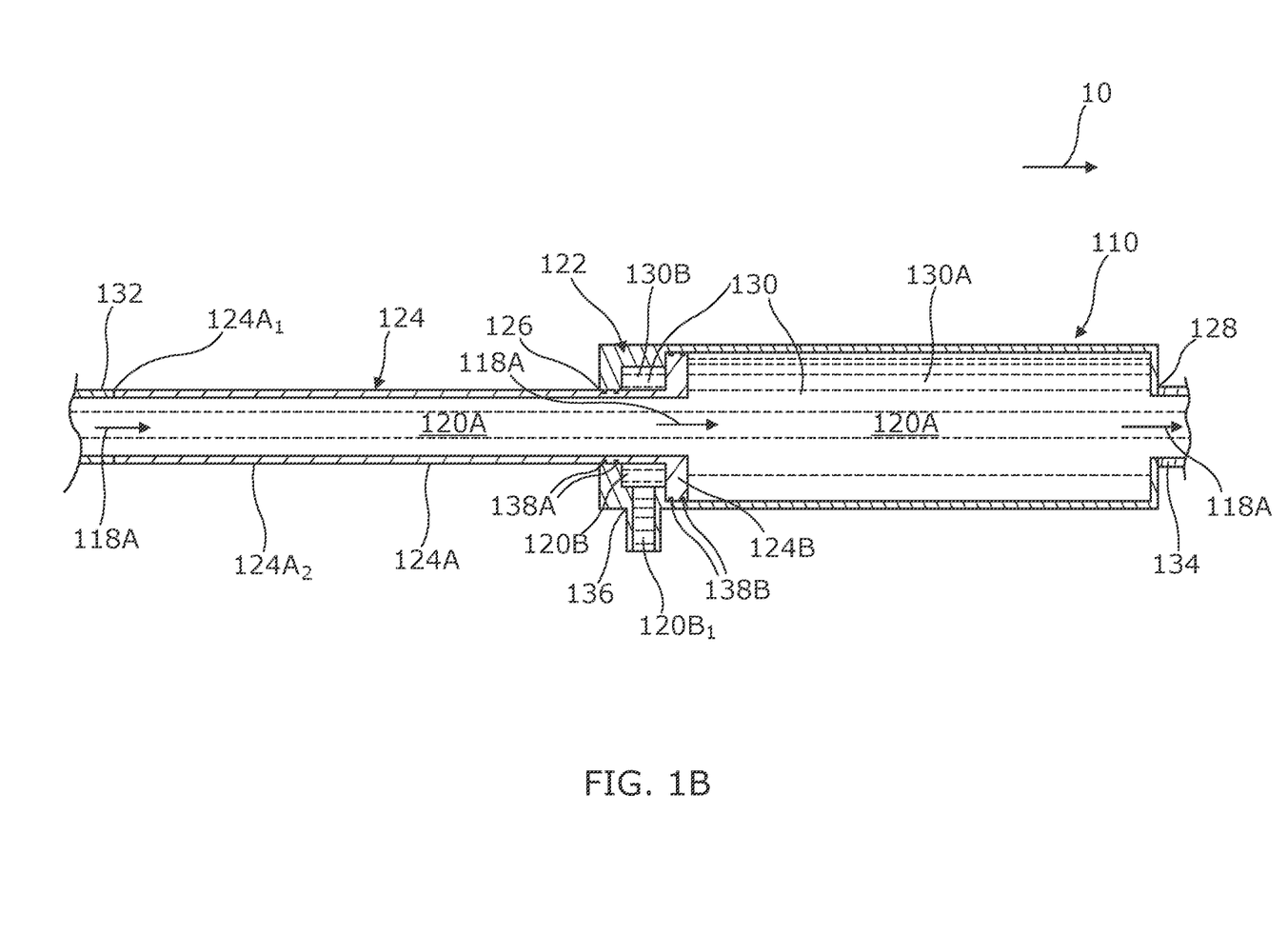
FIG. 1B illustrates a cross-sectional view of a cool fluid reservoir of the coolant distribution unit of FIG. 1A, in a charged state according to the example implementation of the present disclosure.
Figure 1C:
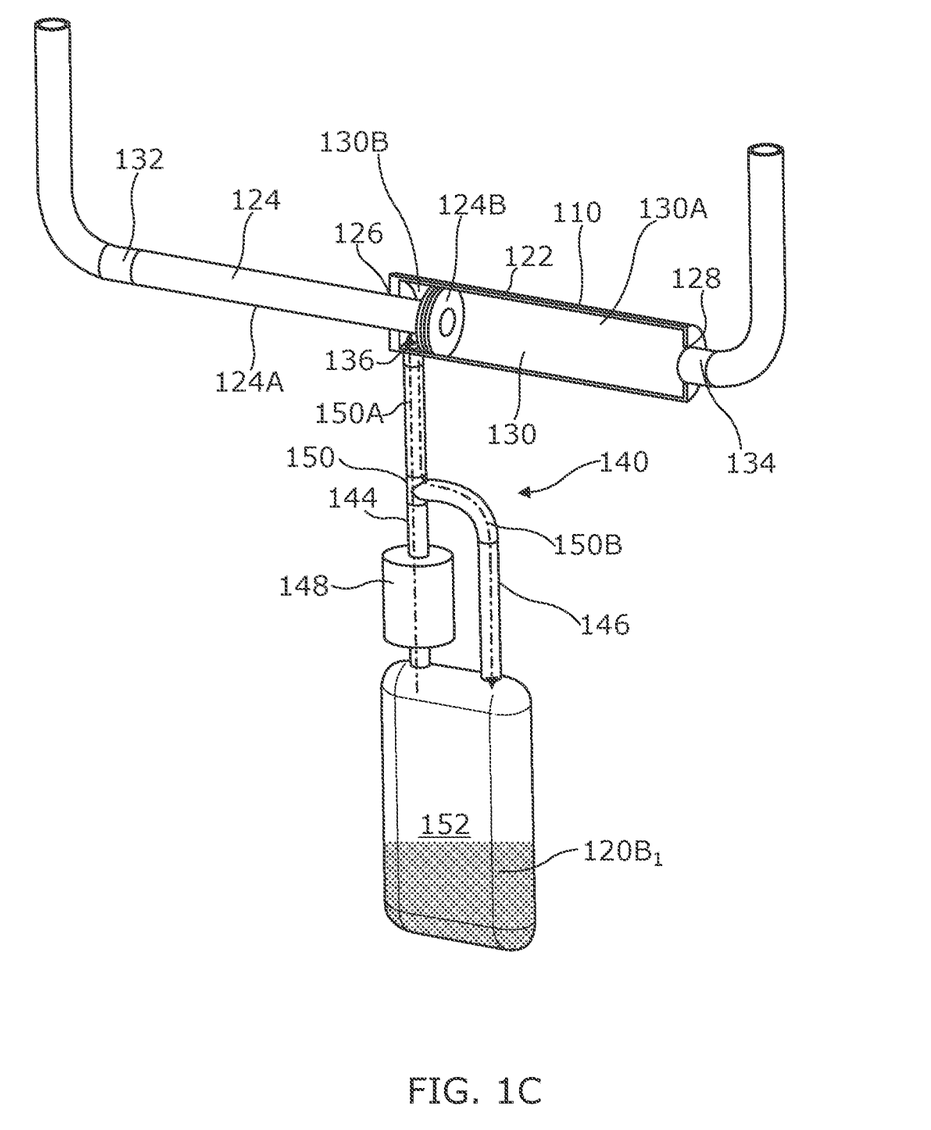
FIG. 1C illustrates a perspective view of a cool fluid reservoir of the coolant distribution unit of FIG. 1A, connected to a driver fluid assembly according to the example implementation of the present disclosure

Turning to the Figures, FIG. 1A depicts a block diagram of a data center environment 100 having a plurality of electronic systems 102 and a thermal management system 104, for example, a CDU 104A. FIG. 1B depicts a cross-sectional view of a cool fluid reservoir 110 of the CDU 104A of FIG. 1A, in a charged state. FIG. 10 depicts a perspective view of the cool fluid reservoir 110 of FIG. 1B, connected to a driver fluid assembly 140. In the description hereinafter, FIGS. 1A-10 are described concurrently for ease of illustration.

Referring to FIG. 1A, the plurality of electronic systems 102 is disposed within an interior space of a chassis 106 (or an enclosure). The CDU 104A and the chassis 106 may be later deployed in a rack or a cabinet (not shown) of the data center environment 100. In such examples, the CDU 104A deployed in the rack may be referred to as a "rack-level CDU" or a "cabinet-level CDU". During the operation of the data center environment 100, the plurality of electronic systems 102 may execute one or more workloads of customer(s) and the CDU 104A may perform thermal management of the plurality of electronic systems 102 deployed in the chassis 106.

In some other examples, a rack may be configured to deploy one or more chassis having only the plurality of electronics systems 102 and another rack may be configured to deploy only a CDU. In such examples, the CDU deployed in the other rack may be referred as a "centralized CDU". During the operation of such data center environment, the centralized CDU may be configured to perform the thermal management of the plurality of electronic systems 102 deployed in each of one or more chassis deployed in the rack.

The plurality of electronic systems 102 may include server systems, storage systems, wireless access points, network switches, routers, or the like. In the example of FIG. 1A, the plurality of electronic systems 102 is server systems 102A. Each of the plurality of electronic systems 102 may include electronic components (not shown), such as central processing units (CPUs), power supply units, memory chips, or other electronic elements, such as capacitors, inductors, resistors, or the like. As discussed herein, the electronic components may generate a considerable amount of waste-heat, while operating to execute one or more workloads of customer(s). In such examples, the CDU 104A may be configured to dissipate the waste-heat from each of the plurality of electronic systems 102 to enable proper functioning of the electronic components and prevent damage to the electronic components due to the waste-heat.

The CDU 104A includes a closed fluid loop 108, a cool fluid reservoir 110, an accumulator 112, a circulation pump 114, a heat exchanger 116, and cooling components (not shown). It may be noted herein that the CDU 104A discussed in the example of FIG. 1A may be referred to as the rack-level CDU or the cabinet-level CDU. In some other examples, the CDU 104A may be the centralized CDU, without deviating from the scope of the present disclosure.

The closed fluid loop 108 may include plumbing tubes, which may be connected to each other at multiple intersections to define a fluid flow path 118. The fluid flow path 118 may direct a flow of a cool fluid 120A and a hot fluid 120C within the closed fluid loop 108 for thermal management of the plurality of electronic systems 102 deployed in the chassis 106. The fluid flow path 118 has a cool fluid flow path 118A (or a main fluid flow path) and a hot fluid flow path 118C connected to each other to form the closed fluid loop 108. The cool fluid flow path 118A extends from the heat exchanger 116 to the plurality of electronic systems 102 via the cool fluid reservoir 110 and the circulation pump 114. In such examples, the accumulator 112 is disposed in between the cool fluid reservoir 110 and the circulation pump 114 and connected to the closed fluid loop 108 via a connector fluid flow path 118B. The hot fluid flow path 118C extends from the plurality of electronic systems 102 to the heat exchanger 116. In one or more examples, the cool fluid flow path 118A directs the flow of the cool fluid 120A from the heat exchanger 116 to the plurality of electronic systems 102, and the hot fluid flow path 118C directs the flow of the hot fluid 120C from the plurality of electronic systems 102 to the heat exchanger 116.

In the example of FIG. 1A, the cool fluid reservoir 110 is disposed in the cool fluid flow path 118A defined by the closed fluid loop 108. In some other examples, the cool fluid reservoir 110 may be disposed in an auxiliary fluid flow path 118D defined by the closed fluid loop 108. The auxiliary fluid flow path 118D may protrude from the main fluid flow path 118A, extend parallel to the main fluid flow path 118A, and merge back to the main fluid flow path 118A. The main fluid flow path 118A may extend directly from the heat exchanger 116 to the circulation pump 114. The cool fluid reservoir 110 disposed in the auxiliary fluid flow path 118D may avoid the issues related to pressure drops at a pump-inlet 114A of the circulation pump 114.

The cool fluid reservoir 110 may function as a makeup cool fluid reservoir and simultaneously function as a fluid connector to interconnect the cool fluid flow path 118A extending from the heat exchanger 116 to the circulation pump 114. Referring to FIG. 1A, the cool fluid reservoir 110 includes a cylinder 122 and a hollow piston 124. Cylinder 122 includes an inlet 126, an outlet 128, and an internal volume 130 defined between the inlet 126 and the outlet 128. The hollow piston 124 includes a hollow-rod section 124A and a hollow-head section 124B extended from the hollow-rod section 124A. The hollow piston 124 is slidably connected to the cylinder 122 via the inlet 126 to split the internal volume 130 into a first volume portion 130A that is filled with the cool fluid 120A and a second volume portion 130B that is filled with a driver fluid 120B. In such examples, the hollow-rod section 124A slides through the inlet 126, and the hollow-head section 124B slides within the cylinder 122. Further, an end section $124A_1$ of the hollow-rod section 124A is directly connected to the closed fluid loop 108 via a first hose 132 and the outlet 128 of the cylinder 122 is connected to the closed fluid loop 108 via a second hose 134 of the closed fluid loop 108. In such examples, a portion $124A_2$ of the hollow-rod section 124A slides through the inlet 126 when the hollow piston 124 is slidably driven by an add-in driver fluid $120B_1$ or an add-in cool fluid $120A_2$. In some examples, the first hose 132 is a flexible hose and the second hose 134 is a rigid hose. Since the first hose 132 is a flexible hose, the portion $124A_2$ of the hollow-rod section 124A is allowed to slide relative to the inlet 126 when the hollow-head section 124B is slidably driven by the add-in driver fluid $120B_1$ or the add-in cool fluid $120A_2$. In one or more examples, the first volume portion 130A of the cylinder 122 is fluidically connected to the cool fluid flow path 118A of the cool fluid loop 108 via the hollow piston 124 and the outlet 128 of the cylinder 122.

Cylinder 122 further includes a first opening 136 formed on a section of the cylinder 122 that corresponds to the second volume portion 130B. In such examples, a driver fluid assembly 140 (as shown in FIGS. 1A and 1C) of the cool fluid reservoir 110 is connected to the second volume portion 130B via the first opening 136. The driver fluid assembly 140 may be configured to pump the driver fluid 120B into the second volume portion 130B to slidably drive the hollow piston 124 along a first direction 10, as discussed in greater detail below.

The cool fluid reservoir 110 shown in the example of FIG. 1B, is in a charged state of the cylinder 122. As used herein the term "charged state" may refer to a physical condition of the cylinder 122, where not less than 90 percent of its internal volume 130 is filled with the cool fluid 120A and not more than 10 percent of its internal volume 130 is filled with the driver fluid 120B. In other words, in the charged state of the cylinder 122, the internal volume 130 of the cylinder 122 may be in a ratio of about 90 percent of the first volume portion 130A and about 10 percent of the second volume portion 130B.

The cool fluid reservoir 110 further includes a pair of first sealing elements 138A and a pair of second sealing elements 138B. The pair of first sealing elements 138A may be coupled to the inlet 126 of the cylinder 122. In such examples, the pair of first sealing elements 138A may seal the interface between the inlet 126 and an outer surface of the hollow-rod section 124A to prevent leakage of the driver fluid 120B from the second volume portion 130B to outside the cool fluid reservoir 110. The pair of second sealing elements 138B may be coupled to the hollow-head section 124B. The pair of second sealing elements 138B may seal the interface between an inner surface of the cylinder 122 and the hollow-head section 124B to prevent the leakage of the driver fluid 120B from the second volume portion 130B into the internal volume 130, for example, the first volume portion 130A of the cylinder 122.

Referring to FIGS. 1A-1B, the cool fluid 120A may flow from the heat exchanger 116 to the circulation pump 114 via the cool fluid reservoir 110. In other words, the first volume portion 130A of the cylinder 122 is fluidically connected to the cool fluid flow path 118A of the closed fluid loop 108 via the hollow piston 124 and the outlet 128 of the cylinder 122 to allow a continuous flow of the cool fluid 120A from the heat exchanger 116 to the circulation pump 114 via the cool fluid reservoir 110. Accordingly, the cool fluid reservoir 110 of the present disclosure may prevent stagnation of the cool fluid 120A within the cool fluid reservoir 110, and thereby overcome one or more problems associated with the stagnation of the cool fluid 120A within the cool fluid reservoir 110. In one or more examples, the cool fluid 120A is one of a mixture of water and propylene glycol with additives, a dielectric fluid, water, or 460-CCL100 and the driver fluid 120B is one of a propylene glycol, a hydraulic fluid, water, or a mixture of water and propylene glycol. In one or more examples, the driver fluid 120B is a non-compressible fluid. In some examples, the mixture of water and propylene glycol may be a ratio from about 95:5 percent to about 50:50 percent. Further, the additives may include corrosion inhibitors and biocides.

In one or more examples, the hollow piston 124 may be slidably driven along the first direction 10 by the driver fluid 120B to reduce the first volume portion 130A (or increase the second volume portion 130B) and inject a portion of the cool fluid 120A from the first volume portion 130A into the cool fluid flow path 118A to make up for the loss of the cool fluid 120A in the CDU 104A, as discussed in greater details below.

Referring back to FIG. 1A, the circulation pump 114 is a fluid pump. The pump-inlet 114A receives the cool fluid 120A directed from the heat exchanger 116 via the cool fluid reservoir 110. The circulation pump 114 pumps the cool fluid 120A from the pump-inlet 114A to the plurality of electronic systems 102 via the cool fluid flow path 118A. In such examples, the cool fluid flow path 118A may be further connected to cooling conduits (not shown) disposed within the chassis 106 in either a series configuration or a parallel configuration. The cooling conduits may direct the flow of the cool fluid 120A to the cooling components, such as cold plates that are disposed in thermal contact with electronic components of each electronic system 102 to transfer the waste-heat from a respective electronic component to the cool fluid 120A, and thereby generate the hot fluid 120C. The cooling conduits may later direct the hot fluid 120C from the plurality of electronic systems 102 to the hot fluid flow path 118C.

The accumulator 112 is connected to the closed fluid loop 108 via the connector fluid flow path 118B. The accumulator 112 may regulate variations in an operating pressure of the cool fluid 120A in the closed fluid loop 108. For example, the accumulator 112 may provide pressure relief in response to variations in the operating pressure caused due to pressure spikes and/or thermal expansion and contraction of the cool fluid 120A in the closed fluid loop 108. The pressure spikes and/or thermal expansion and contraction may occur due to excessive or moderate rates of waste-heat generated by the electronic systems 102 for executing one or more workloads. The accumulator 112 may ensure that positive pressure is maintained within cool fluid flow path 118A, for example, at the pump-inlet 114A for directing the flow of the cool fluid 120A in the cool fluid flow path 118A of the closed fluid loop 108. For example, accumulator 112 may store a pressurized cool fluid $120A_1$ within a diaphragm (or a bladder) at a stretched state of the diaphragm (not shown). During the operation of the accumulator 112, the diaphragm may get partially contracted to push a portion of the pressurized cool fluid $120A_1$ into the cool fluid flow path 118A and expanded to pull the portion of the cool fluid 120A from the cool fluid flow path 118A into the diaphragm in response to the pressure spikes and/or thermal contraction or expansion of the cool fluid 120A in the closed fluid loop 108.

The hot fluid flow path 118C may direct the flow of the hot fluid 120C from the plurality of electronic systems 102 into the heat exchanger 116. In one or more examples, the heat exchanger 116 dissipates the waste-heat in the hot fluid 120C and regenerates the cool fluid 120A. In some examples, the heat exchanger 116 may be a liquid heat-exchanger, a rear door heat-exchanger, or the like. In one or more examples, the heat exchanger 116 may receive facility cool fluid 142A from the data center environment to dissipate the waste-heat from the hot fluid 120C and regenerate the cool fluid 120A. For example, the heat exchanger 116 may indirectly transfer the waste-heat from the hot fluid 120C to the facility cool fluid 142A, and regenerate the cool fluid 120A and a facility hot fluid 142B. The heat exchanger 116 may later direct the regenerated cool fluid 120A to the pump-inlet 114A of the circulation pump 114 via the cool fluid reservoir 110.

Even though the CDU depicted in the example of FIG. 1A has a single cool fluid reservoir connected to the closed fluid loop, in some other examples, the CDU may include a plurality of cool fluid reservoirs without deviating from the scope of the present disclosure. In some examples, the single cool fluid reservoir may be too large to retrofit in an available space of the CDU due to one of a stroke length of the hollow piston, a diameter of the cylinder, or combination thereof. Thus, the plurality of small-sized cool fluid reservoirs may be retrofitted in the available space of the CDU instead of the single cool fluid reservoir to overcome the aforementioned problems related to the available space of the CDU. In such examples, an overall internal volume of the plurality of small-sized cool fluid reservoirs may need to match to the internal volume of the single cool fluid reservoir. In some examples, the plurality of small-sized cool fluid reservoirs may be connected to the closed fluid loop in one of a series configuration, a parallel configuration, or combinations thereof depending on the cooling requirement of the plurality of electronic systems.

Referring to FIG. 10, the driver fluid assembly 140 of the cool fluid reservoir 110 is connected to the second volume portion 130B of the cylinder 122 via the first opening 136. The driver fluid assembly 140 includes a main conduit 144, a bypass conduit 146, a driver pump 148 connected to the main conduit 144, a valve 150, and a driver fluid reservoir 152. The main conduit 144 is connected to the first opening 136 and the driver fluid reservoir 152 via the driver pump 148. The valve 150 is connected to the main conduit 144 and disposed between the driver pump 148 and the first opening 136. The bypass conduit 146 is connected to the valve 150 and the driver fluid reservoir 152.

In some examples, the driver pump 148 is a fluid pump. The valve 150 is a three-way valve having multiple positions, such as a cut-off, a first on, and a second on positions. In some examples, the valve 150 may be manually switched between multiple positions. In such examples, the driver pump 148 may also be manually turned on or turned off. In some other examples, the valve 150 may be automatically switched between multiple positions. In such examples, the driver pump 148 may also be automatically turned on or turned off. In the cut-off position, the valve 150 may stop a flow of driver fluid $120B_1$ from the second volume portion 130B to the driver fluid assembly 140 and vice versa. In the first on position, the valve 150 may establish an inlet flow path 150A from the driver fluid reservoir 152 to the second volume portion 130B via the driver pump 148, the main conduit 144, and the first opening 136. In the second on position, the valve 150 may establish an outlet flow path 150B from the second volume portion 130B to the driver fluid reservoir 152 via the first opening 136, a portion of the main conduit 144, and the bypass conduit 146. The driver fluid reservoir 152 may have an add-in driver fluid $120B_1$ stored in its internal volume.

In one or more examples, the CDU 104A may tend to lose some portion of cool fluid 120A over time due to evaporation within the closed fluid loop 108 and/or dripping from one or more plumbing joints of the CDU 104A. Accordingly, such loss of the cool fluid 120A may gradually decrease an operating pressure of the cool fluid 120A in the closed fluid loop 108. As used herein the term "operating pressure" may refer to a pressure about which the CDU is designed to operate by circulating the cool fluid through the closed fluid loop. When the operating pressure drops below a threshold pressure at the pump-inlet 114A of the circulation pump 114, it can cause cavitation of the circulation pump 114, resulting in damage to the pump. Further, cavitation may occur at certain pressure points in the plumbing joints of the CDU 104A, resulting in damage to the plumbing of the CDU 104A, and thereby leading to a premature failure of the CDU 104A. It may be noted herein that the term "threshold pressure" may refer to a minimum pressure that is required for circulation of the cool fluid 120A in the closed fluid loop 108. In some examples, the operating pressure may be about 10 pounds per square inch (psi) to about 150 psi and the threshold pressure may be about 5 psi. In one or more examples, the hollow piston 124 of the cool fluid reservoir 110 may be actuated (e.g., pushed or slid), when the operating pressure drops below the threshold pressure, to reduce the first volume portion 130A of the cylinder 122, and inject the portion of the cool fluid 120A from the first volume portion 130A into the closed fluid loop 108 to return pressure levels to the operating pressure, as discussed in greater details below. Thus, the cool fluid reservoir 110 may additionally prevent the problems associated with cavitation of the circulation pump 114 and plumbing in the CDU 104A.

Figure 1D:
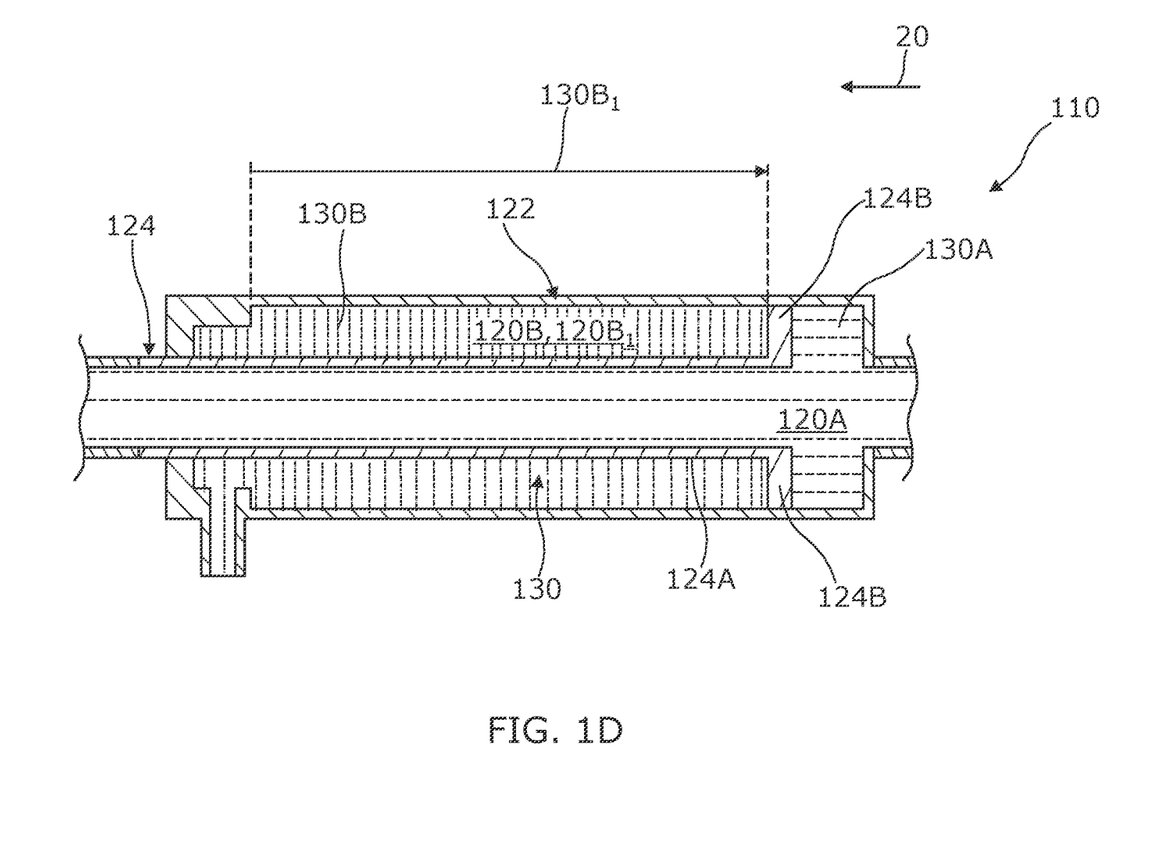
FIG. 1D illustrates a cross-sectional view of a cool fluid reservoir of the coolant distribution unit of FIG. 1A, in a discharged state according to the example implementation of the present disclosure.

FIG. 1D depicts a cross-sectional view of the cool fluid reservoir 110 in a discharged state. In the description hereinafter, FIG. 1D is discussed by referring to FIGS. 1A-1C for ease of illustration. As discussed hereinabove, when the operating pressure of the cool fluid 120A in the closed fluid loop 108 drops below the threshold pressure, the valve 150 may be turned to the first on position from the cut-off position. In the first on position, the driver pump 148 may be turned on to pump the add-in driver fluid $120B_1$ from the driver fluid reservoir 152 into the second volume portion 130B via the inlet flow path 150A. The add-in driver fluid $120B_1$ pumped into the second volume portion 130B may slidably drive the hollow piston 124 along the first direction 10 to reduce the first volume portion 130A (or increase the second volume portion 130B) and inject a portion of the cool fluid 120A from the first volume portion 130A into the closed fluid loop 108. In some examples, the portion of the cool fluid 120A injected into the closed fluid loop 108 may correspond (or match) to a portion of the add-in driver fluid $120B_1$ added into the second volume portion 130B (or an increased second volume portion $130B_1$ of the cylinder 122). Accordingly, the portion of the cool fluid 120A that is added (or injected) into the closed fluid loop 108 may make up for the loss of the cool fluid 120A in CDU 104A and simultaneously return the pressure levels of the cool fluid 120A in the closed fluid loop 108 to the operating pressure.

As mentioned above, the cool fluid reservoir 110 shown in the example of FIG. 1D, is in a discharged state of the cylinder 122. As used herein the term "discharged state" may refer to another physical condition of the cylinder 122, where not more than 10 percent of its internal volume 130 is filled with the cool fluid 120A and not less than 90 percent of its internal volume 130 is filled with the driver fluid 120B. In other words, in the discharged state of the cylinder 122, the internal volume 130 of the cylinder 122 may be in a ratio of about 10 percent of the first volume portion 130A and about 90 percent of the second volume portion 130B.

Figure 2:
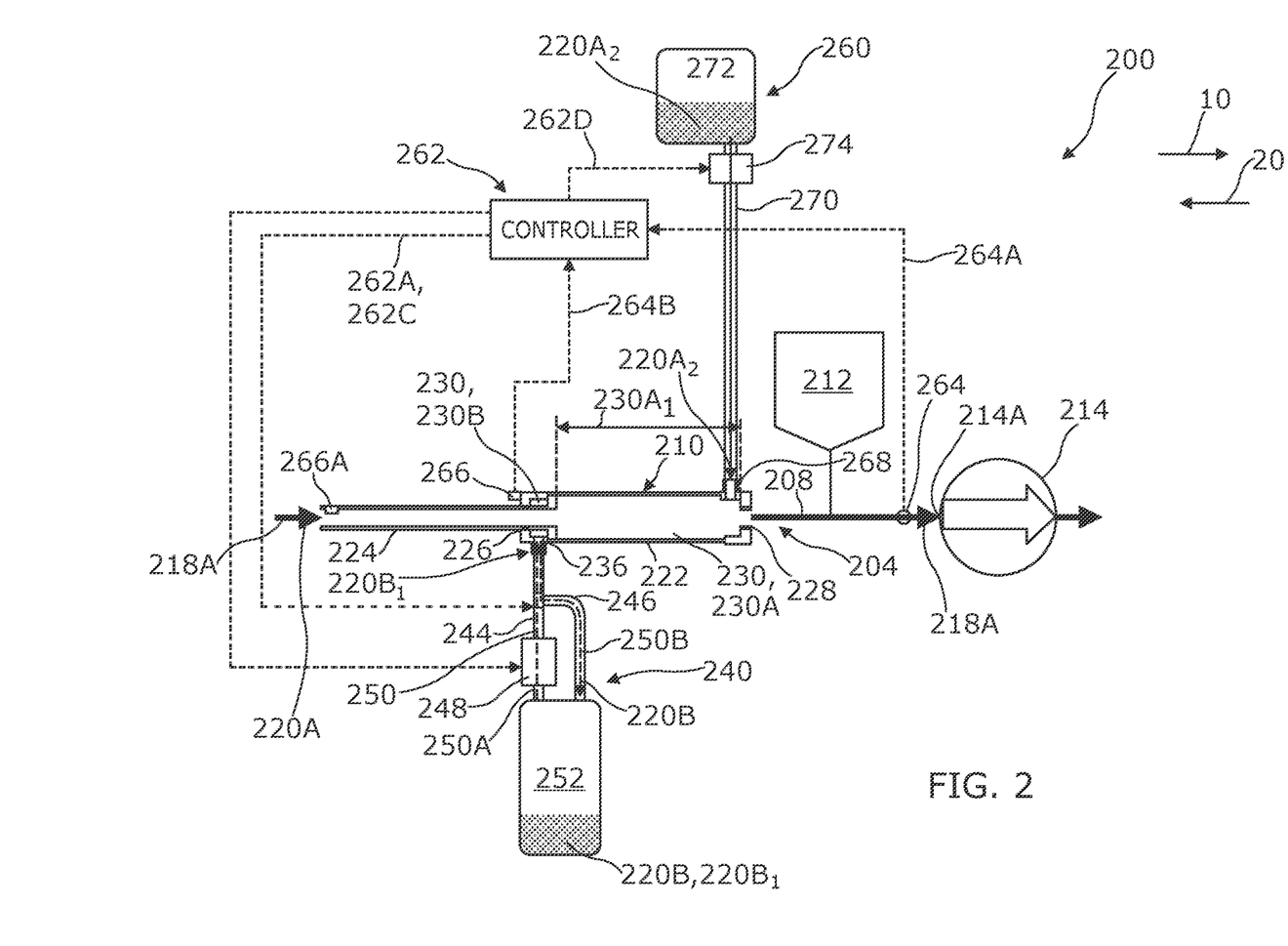
FIG. 2 illustrates a block diagram of a portion of a data center environment having a portion of a coolant distribution unit and a controller according to another example implementation of the present disclosure.

In some examples, when the cool fluid reservoir 110 reaches the discharged state, the first volume portion 130A may be filled with an add-in cool fluid $120A_2$ by using an add-in cool fluid assembly 260 (as shown in FIG. 2) to reinstate the cool fluid reservoir 110 to the charged state (as shown in FIG. 1A). In some examples, the steps involved in reinstating the cool fluid reservoir 110 from the discharged state to the charged state may be performed using manual operations. In some examples, the steps involved in reinstating the cool fluid reservoir 110 from the discharged state to the charged state may be performed automatically, as discussed in greater detail in the example of FIG. 2.

FIG. 2 depicts a block diagram of a portion of a data center environment 200 having a portion of a CDU 204 and a controller 262. The data center environment 200 may additionally include a plurality of electronic systems (not shown), a pressure sensor 264, and a limit switch 266. It may be noted that the plurality of electronic systems may be substantially similar to a plurality of electronic systems 102 of FIG. 1A, without deviating from the scope of the present disclosure.

Further, the CDU 204 is substantially similar to a CDU 104A of FIG. 1A. For example, the CDU 204 includes a closed fluid loop 208, a cool fluid reservoir 210, an accumulator 212, a circulation pump 214, a heat exchanger (not shown), cooling components (not shown), a driver fluid assembly 240, and an add-in cool fluid assembly 260. It may be noted that the add-in cool fluid assembly 260 is an additional component/device in the CDU 204 when compared with other components/devices of the CDU 104A, as shown in the example of FIG. 1A. Accordingly, the following descriptions of the CDU 204 do not further describe the closed fluid loop 208, the accumulator 212, the circulation pump 214, the heat exchanger, the cooling components, and the driver fluid assembly 240 for the sake of brevity, and such non-descriptions should not be considered as a limitation of the present disclosure.

The cool fluid reservoir 210 includes a cylinder 222 and a hollow piston 224, as discussed in the example of FIGS. 1A-1C. The cylinder 222 includes an internal volume 230 defined between an inlet 226 and an outlet 228. The hollow piston 224 is slidably connected to the cylinder 222 via the inlet 226 to split the internal volume 230 into a first volume portion 230A and a second volume portion 230B. The first volume portion 230A is filled with a cool fluid 220A and the second volume portion 230B is filled with a driver fluid 220B. The first volume portion 230A is fluidically connected to the closed fluid loop 208 via the hollow piston 224 and the outlet 228. The cool fluid reservoir 210 of FIG. 2 additionally includes a second opening 268 formed on another section of the cylinder 222 that corresponds to the first volume portion 230A. In such examples, the add-in cool fluid assembly 260 is connected to the first volume portion 230A via the second opening 268, as discussed in detail below.

As noted in the example of FIG. 10, the driver fluid assembly 240 of FIG. 2 also includes a main conduit 244, a bypass conduit 246, a driver pump 248 connected to the main conduit 244, a valve 250, and a driver fluid reservoir 252. In such examples, the main conduit 244 is connected to the first opening 236 and the driver fluid reservoir 252 via the driver pump 248. Further, the valve 250 is connected to the main conduit 244 and disposed between the driver pump 248 and the first opening 236. The bypass conduit 246 is connected to the valve 250 and the driver fluid reservoir 252. As discussed hereinabove (referring to FIGS. 1A-1C), the driver fluid assembly 240 may be used to inject an add-in driver fluid 220B$_1$ into the cool fluid reservoir 210, to drive the cool fluid reservoir 210 from the charged state to the discharged state to make up for the loss of the cool fluid 220A in the closed fluid loop 208 of the CDU 204, and return the pressure levels of the closed fluid loop 208 to the operating pressure.

In one or more examples, the add-in cool fluid assembly 260 includes a supplementary conduit 270, an add-in cool fluid reservoir 272, a supplementary pump 274 connected to the supplementary conduit 270. In some examples, the supplementary pump 274 is a fluid pump. The supplementary conduit 270 is connected to the second opening 268 and the add-in cool fluid reservoir 272 via the supplementary pump 274. As noted hereinabove, the add-in cool fluid assembly 260 is used to reinstate the cool fluid reservoir 110 from the discharged state to the charged state.

To reinstate the cool fluid reservoir 210 to the charged state, the valve 250 is first moved to a second on position from a cut-off position to establish an outlet flow path 250B from the second volume portion 230B to the driver fluid reservoir 252 via a first opening 236, a portion of the main conduit 244, the bypass conduit 246. Later in the second on position of the valve 250, the supplementary pump 274 is turned on to pump an add-in cool fluid 220A$_2$ from the add-in cool fluid reservoir 272 into the first volume portion 230A. In such examples, the add-in cool fluid 220A$_2$ pumped into the first volume portion 230A slidably drives the hollow piston 224 along a second direction 20 opposite to the first direction 10 and pushes a portion of the driver fluid 220B from the second volume portion 230B into the driver fluid reservoir 252 via the outlet flow path 250B. In some examples, the portion of the driver fluid 220B pushed into (back to) the driver fluid reservoir 252 may correspond (or match) to the portion of the add-in cool fluid 220A$_2$ refilled into the first volume portion 130A (or an increased first volume portion 230A$_1$ of the cylinder 122). Thus, the portion of the add-in cool fluid 220A$_2$ added (or injected) into first volume portion 230A may assist the cool fluid reservoir 210 to reinstate to the charged condition.

In the example of FIG. 2, the controller 262 is shown to be disposed within the data center environment 200. In some other examples, the controller 262 may be disposed outside the data center environment 200. In one or more examples, the controller 262 may be located within a data center management server, which is accessed by an administrator of the data center environment 200. Persons of skill in the art will understand that the controller 262 may include a processing resource and machine-readable medium (e.g., memory) to facilitate the execution of the functionality described herein. In some examples, the processing resource may be a physical processor, such as a central processing unit (CPU), a microprocessor, and/or other hardware devices suitable for performing the functionality described herein. In some examples, the machine-readable medium is non-transitory and is alternatively referred to as a non-transitory machine-readable medium. The controller 262 is communicatively coupled to the driver pump 248, the supplementary pump 274, and the valve 250.

The pressure sensor 264 is disposed on the closed fluid loop 208. For example, the pressure sensor 264 is located at a pump-inlet 214A and communicatively coupled to the controller 262. The pressure sensor 264 is configured to detect the operating pressure of the cool fluid 220A at the pump-inlet 214A and communicate a first input signal 264A to the controller 262. The first input signal 264A may be indicative of the operating pressure of the cool fluid 220A at the pump-inlet 214A. The limit switch 266 is disposed on the cylinder 222 and communicatively coupled to the controller 262. For example, the limit switch 266 is located proximate to the inlet 226 of the cylinder 222. The limit switch 266 may further include an electronic mechanical object 266A disposed proximate to the other end of the hollow piston 224. The limit switch 266 may detect a position of the hollow piston 224 when the electronic mechanical object 266A approaches a threshold position. For example, the limit switch 266 may detect the presence of the electronic mechanical object 266A when the hollow piston 224 slides within the cylinder 222 along the first direction 10 and reaches the threshold position, where the second volume portion 230B and the first volume portion 230A are about 90:10 percent respectively of the internal volume 230. Accordingly, the limit switch 266 may generate a second input signal 264B, which is indicative of the discharged state of the cool fluid reservoir 210, and communicate the second input signal 264B to the controller 262.

In some examples, the driver fluid assembly 240 and the add-in cool fluid assembly 260 may be configured to operate automatically to perform their intended functions. For example, the controller 262 may periodically receive the first input signal 264A from the pressure sensor 264, which is indicative of the operating pressure at the pump-inlet 214A. The controller 262 may compare the operating pressure data received from the pressure sensor 264 with a threshold pressure data stored in its memory to determine whether the operating pressure is below or above the threshold pressure. In such examples, when the controller 262 determines that the operating pressure is below the threshold pressure, the controller 262 may send a first control signal 262A to the valve 250 and a second control signal 262B to the driver pump 248. In some examples, upon receipt of the first control signal 262A, the valve 250 may move from the cut-off position to the first on position to establish an inlet flow path 250A from the driver fluid reservoir 252 to the second volume portion 230B. After the valve 250 has moved to the first on position, the second control signal 262B may trigger the driver pump 248 to pump the add-in driver fluid 220B$_1$ from the driver fluid reservoir 252 into the second volume portion 230B via the inlet flow path 250A. The addition of the add-in driver fluid 220B$_1$ into the second volume portion 230B may slidably drive the hollow piston 224 along the first direction 10 to reduce the first volume portion 230A (or increase the second volume portion 230B) and inject a portion of the cool fluid 220A from the first volume portion 230A into the closed fluid loop 208. Thus, the driver fluid assembly 240 may automatically manage the loss of the cool fluid 220A in the closed fluid loop 208 of the CDU 204, and return the pressure levels of the closed fluid loop 208 to the operating pressure.

The controller 262 may further receive the second input signal 264B from the limit switch 266 when the electronic mechanical object 266A on the hollow piston 224 approaches the limit switch 266. The second input signal 264B may be indicative of the discharged state of the cool fluid reservoir 210. Accordingly, upon receipt of the second input signal 264B, the controller 262 may generate a third control signal 262C to the valve 250 and a fourth control signal 262D to the supplementary pump 274. In some examples, upon receipt of the third control signal 262C, the valve 250 may move from the cut-off position to the second on position to establish an outlet flow path 250B from the second volume portion 230B to the driver fluid reservoir 252. After the valve 250 has moved to the second on position, the fourth control signal 262D may trigger the supplementary pump 274 to pump the add-in cool fluid $220A_2$ from the add-in cool fluid reservoir 272 into the first volume portion 230A. The addition of the add-in cool fluid $220A_2$ into the first volume portion 230A may slidably drive the hollow piston 224 along the second direction 20 opposite to the first direction 10 to reduce the second volume portion 230B (or increase the first volume portion 230A) and push a portion of the driver fluid 220B from the second volume portion 230B into the driver fluid reservoir 252 via the outlet flow path 250B. Thus, the add-in cool fluid assembly 260 may automatically manage the refilling of the add-in cool fluid $220A_2$ into the first volume portion 230A of the cylinder 220 to move the cool fluid reservoir 210 from the discharged state to the charged state.

Figure 3:
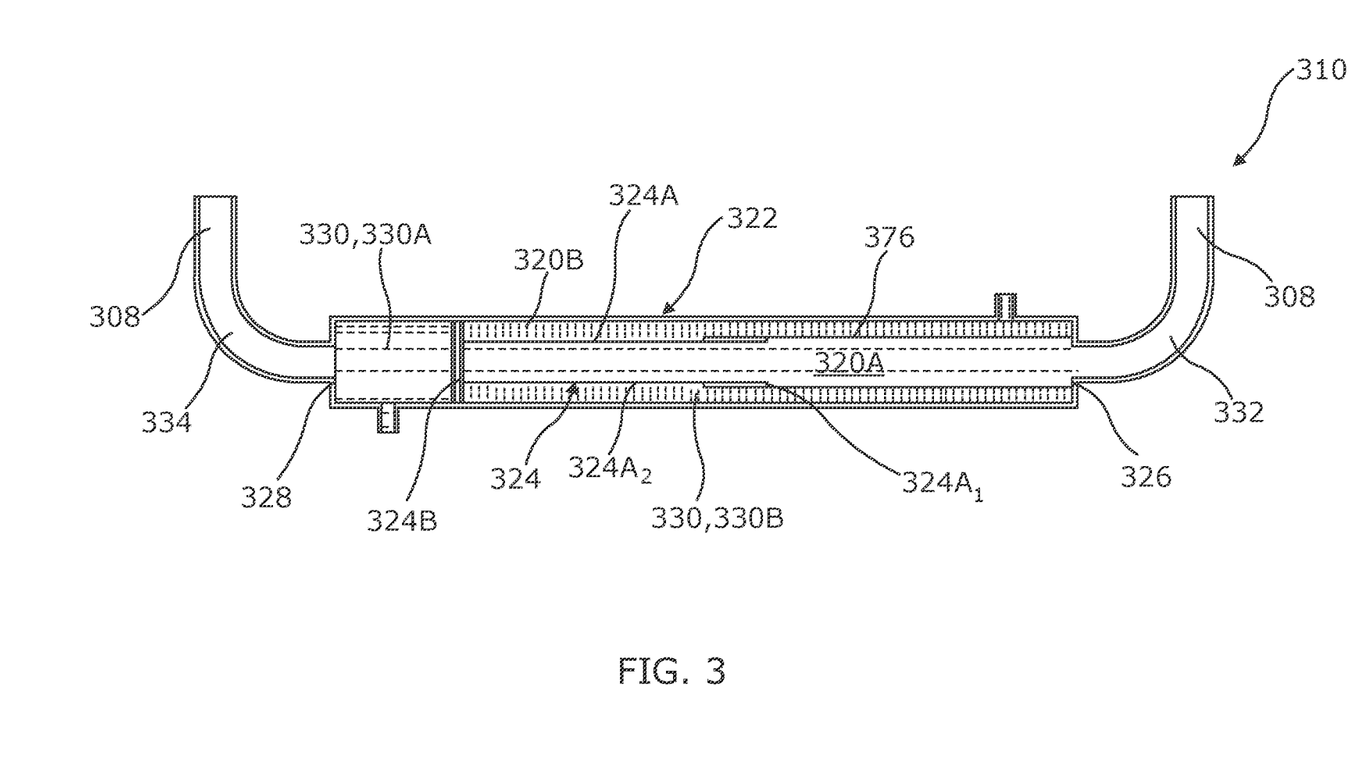
FIG. 3 illustrates a cross-sectional view of a cool fluid reservoir according to another example implementation of the present disclosure.

FIG. 3 depicts a cross-sectional view of a cool fluid reservoir 310. As noted in the example of FIG. 1B, the cool fluid reservoir 310 of FIG. 3 includes a cylinder 322 and a hollow piston 324. The cylinder includes an inlet 326, an outlet 328, and an internal volume 330 defined between the inlet 326 and the outlet 328. The hollow piston 324 includes a hollow-rod section 324A and a hollow-head section 324B extended from the hollow-rod section 324A. The hollow piston 324 is slidably connected to the cylinder 322 to split the internal volume 330 into a first volume portion 330A that is filled with the cool fluid 320A and a second volume portion 330B that is filled with a driver fluid 320B. The example of FIG. 3 additionally includes a hollow tube 376, which is disposed within the cylinder 322 and connected to the inlet 326 of the cylinder 322. The hollow tube 376 is further connected to a closed fluid loop 308 via a first hose 332. In such examples, an end section $324A_1$ of the hollow-rod section 324A is disposed within the hollow tube 376 and fluidically connected to the closed fluid loop 308 via the hollow tube 376. Further, a portion $324A_2$ of the hollow-rod section 324 slides relative to the hollow tube 376 when the hollow-head section 324B is slidably driven by an add-in driver fluid or an add-in cool fluid. Further, the outlet 328 of the cylinder 322 is connected to the closed fluid loop 308 via a second hose 334. In some examples, the first hose 332 and the second hose 334 are rigid hoses.

Figures 4A, 4B:
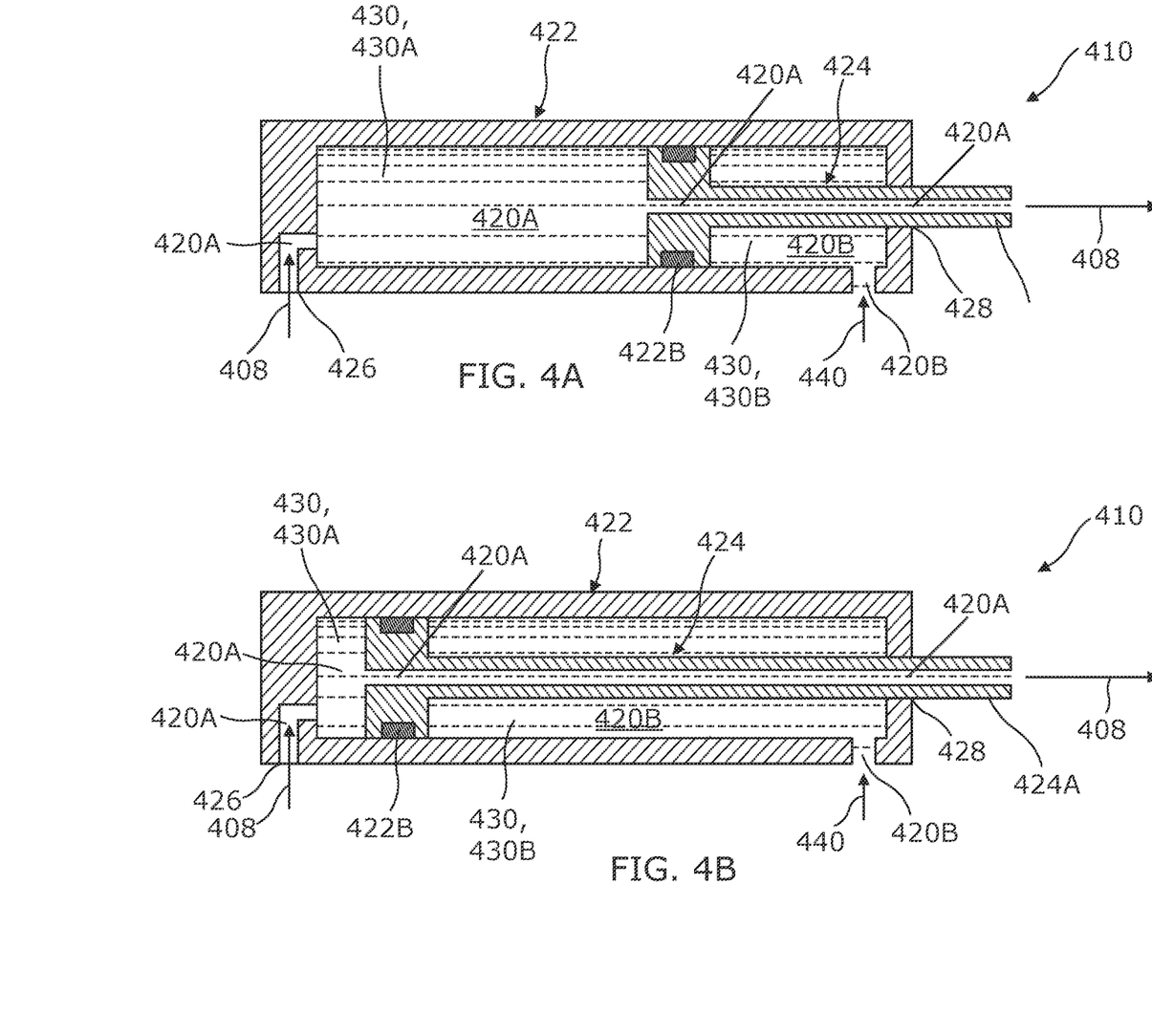
FIG. 4A illustrates a cross-sectional view of a cool fluid reservoir in a charged state according to another example implementation of the present disclosure.
FIG. 4B illustrates a cross-sectional view of a cool fluid reservoir in a discharged state according to another example implementation of the present disclosure.
Figure 5:
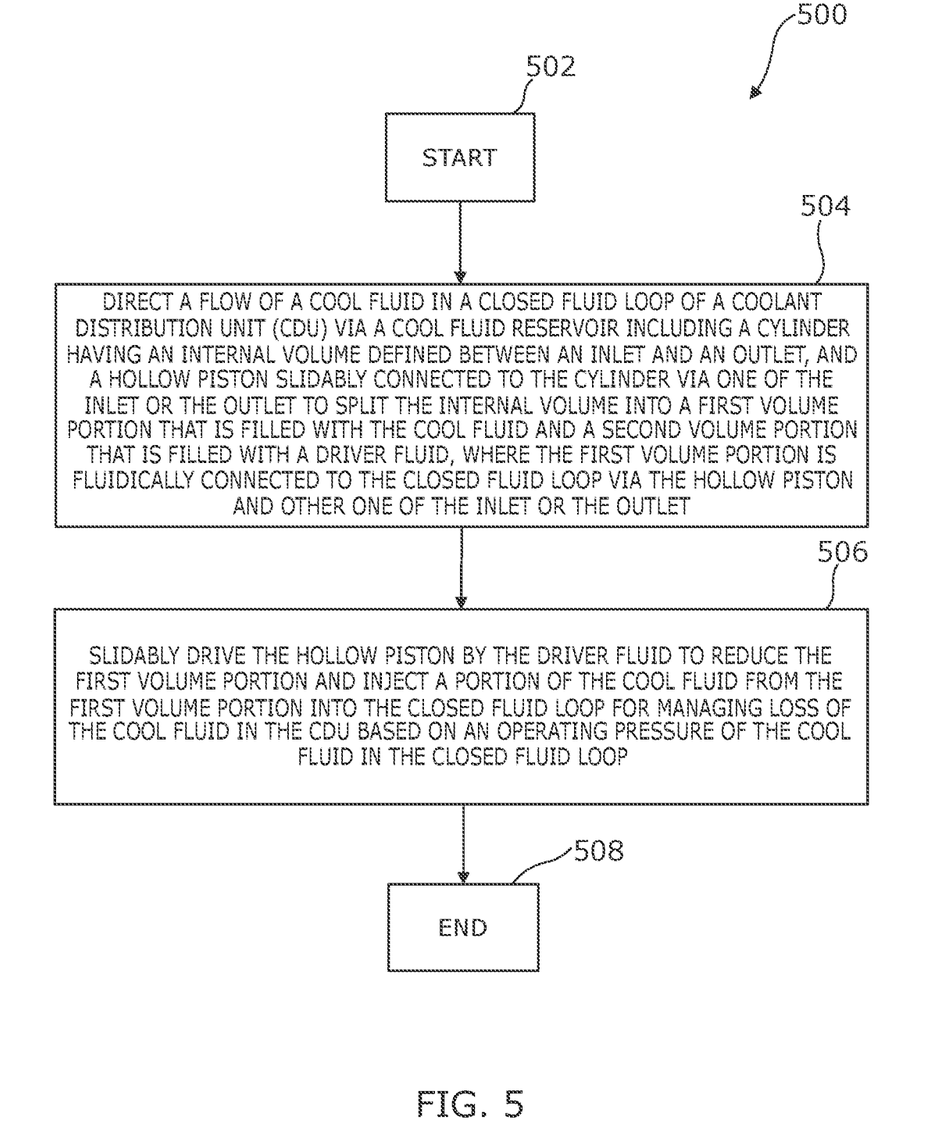
FIG. 5 illustrates a flowchart depicting a method of operating a cool fluid reservoir for managing the loss of the cool fluid in a coolant distribution unit according to an example implementation of the present disclosure.

FIG. 4A depicts a cross-sectional view of a cool fluid reservoir 410 in a charged state. FIG. 4B depicts a cross-sectional view of the cool fluid reservoir 410 in a discharged state. In the description hereinafter, FIGS. 4A-4B are described concurrently for ease of illustration.

As noted in the example of FIG. 1B, the cool fluid reservoir 410 of FIG. 4 includes a cylinder 422 and a hollow piston 424. The cylinder 422 has an inlet 426, an outlet 428, and an internal volume 430 defined between the inlet 426 and the outlet 428. The hollow piston 424 has a hollow-rod section 424A and a hollow-head section 424B. The hollow piston 424 is slidably connected to the cylinder 422 via the outlet 428, unlike a hollow piston 124, which is slidably connected to the cylinder 422 via an inlet 126 as shown in the example of FIG. 1B. The hollow piston 424 slidably connected to the cylinder 422 splits the internal volume 430 into a first volume portion 430A and a second volume portion 430B. The first volume portion 430A is filled with a cool fluid 420A and the second volume portion 430B is filled with a driver fluid 420B. The first volume portion 430A is fluidically connected to the closed fluid loop 408 via the hollow piston 424 and the outlet 428 to allow a continuous flow of the cool fluid 420A into the closed fluid loop 408. Since the cool fluid 420A filled in the first volume portion 430A flows continuously, stagnation of the cool fluid 420A may not occur in the cool fluid reservoir 410. Accordingly, the cool fluid reservoir 410 of the present disclosure may overcome one or more problems associated with the stagnation of the cool fluid 420A stored in the existing fluid reservoir.

Referring to FIG. 4B, when an operating pressure of the cool fluid 420A drops below a threshold pressure, the cool fluid reservoir 410 may inject a portion of the cool fluid 420A into the closed fluid loop 408 to return the pressure levels to the operating pressure. For example, the driver fluid 420B is added into the second volume portion 430B by a driver fluid assembly 440, to slidably drive the hollow piston 424 and reduce the first volume portion 430A, thereby injecting the portion of the cool fluid 420A into the closed fluid loop 408. In such examples, the hollow-rod section 424A slides relative to the outlet 428 when the hollow-head section 424B is slidably driven by the driver fluid 420B added into the second volume portion 430B. Since the hollow piston 424 is slidably driven to inject the portion of the cool fluid 420A into the closed fluid loop 408, the cool fluid reservoir 410 may manage the loss of the cool fluid 420A in a CDU, based on the operating pressure. Further, the cool fluid reservoir 410 may additionally prevent problems associated with cavitation of circulation pumps and plumbing in the CDU due to a drop in the operating pressure of the cool fluid 420A.

FIG. 5 is a flow diagram a flowchart depicting a method 500 of operating a cool fluid reservoir for managing the loss of the cool fluid in a coolant distribution unit. It should be noted herein that the method 500 is described in conjunction with FIGS. 1A-1C, for example.

The method 500 starts at block 502 and continues to block 504. At block 504, the method 500 includes directing a flow of a cool fluid in a closed fluid loop of a CDU via a cool fluid reservoir. In some examples, the cool fluid reservoir includes a cylinder having an internal volume defined between an inlet and an outlet, and a hollow piston slidably connected to the cylinder via one of the inlet or the outlet to split the internal volume into a first volume portion that is filled with the cool fluid and a second volume portion that is filled with a driver fluid. In such examples, the first volume portion is fluidically connected to the closed fluid loop via the hollow piston and other one of the inlet or the outlet to allow a continuous flow of the cool fluid to the closed fluid loop via the cool fluid reservoir. Since the cool fluid filled in the internal volume (i.e., first volume portion) of the cool fluid reservoir flows continuously, stagnation of the cool fluid may not occur in the cool fluid reservoir. Accordingly, the cool fluid reservoir of the present disclosure may overcome one or more problems associated with the stagnation of the cool fluid stored in the existing fluid reservoir. The method 500 continues to block 506.

At block 506, the method 500 includes slidably driving the hollow piston by the driver fluid to reduce the first volume portion and inject a portion of the cool fluid from the first volume portion into the closed fluid loop. In one or more examples, the portion of the cool fluid injected into the closed fluid loop may correspond to the portion of the driver fluid added into the second volume portion (or a reduced first volume portion of the cylinder). In some examples, when an operating pressure of the cool fluid in the closed fluid loop drops below a threshold pressure, the driver fluid may be added into the second volume portion to reduce the first volume portion and inject the portion of the cool fluid from the first volume portion into the closed fluid loop to return pressure levels to the operating pressure. Since the hollow piston may be slidably driven to inject the portion of the cool fluid from the first volume portion into the closed fluid loop, the cool fluid reservoir may manage the loss of the cool fluid in the CDU based on the operating pressure. Additionally, the cool fluid reservoir may prevent the problems associated with cavitation of circulation pumps and plumbing in a CDU. The method 500 ends at block 508.

Various features as illustrated in the examples described herein may be implemented in a cool fluid reservoir for a CDU, such as a centralized CDU or a rack-level or cabinet-level CDU. Accordingly, the cool fluid reservoir may ensure that there is no stagnation of the cool fluid in its internal volume, and simultaneously manage the loss of the cool fluid in the CDU based on an operating pressure of the cool fluid in the closed fluid loop. Since there is no stagnation of the cool fluid, the cool fluid reservoir may reduce the risk of biological growth/contamination due to the stagnant fluid. The cool fluid reservoir may be actuated using an existing controller of a data center management server.

In the foregoing description, numerous details are set forth to provide an understanding of the subject matter disclosed herein. However, the implementation may be practiced without some or all of these details. Other implementations may include modifications, combinations, and variations from the details discussed above. It is intended that the following claims cover such modifications and variations.

What is claimed is:

1. A cool fluid reservoir comprising:
   a cylinder having an internal volume defined between an inlet and an outlet, and a first opening;
   a hollow piston slidably connected to the cylinder via one of the inlet or the outlet to split the internal volume into a first volume portion that is filled with a cool fluid and a second volume portion that is filled with a driver fluid; and
   a driver fluid assembly comprising a driver pump fluidically coupled to the second volume portion via the first opening, wherein the first opening is formed on a section of the cylinder that corresponds to the second volume portion,
   wherein the first volume portion is fluidically connected to a closed fluid loop of a coolant distribution unit (CDU) via the hollow piston and another one of the inlet or the outlet, and wherein the driver pump pumps the driver fluid into the second volume portion via the first opening to slidably drive the hollow piston along a first direction to reduce the first volume portion and inject a portion of the cool fluid from the first volume portion into the closed fluid loop based on an operating pressure of the cool fluid in the closed fluid loop.

2. The cool fluid reservoir of claim 1, wherein the driver fluid assembly further comprises a main conduit, a bypass conduit, a valve, and a driver fluid reservoir, wherein the main conduit is connected to the first opening and the driver fluid reservoir via the driver pump, wherein the valve is disposed between the driver pump and the first opening and connected to the main conduit, and wherein the bypass conduit is connected to the valve and the driver fluid reservoir.

3. The cool fluid reservoir of claim 2, wherein the valve is moved to a first on position from a cut-off position to establish an inlet flow path from the driver fluid reservoir to the second volume portion via the main conduit, the driver pump, and the first opening, and wherein, in the first on position of the valve, the driver pump pumps an add-in driver fluid from the driver fluid reservoir into the second volume portion via the inlet flow path to slidably drive the hollow piston along the first direction.

4. The cool fluid reservoir of claim 3, further comprising a supplementary conduit, a supplementary pump connected to the supplementary conduit, an add-in cool fluid reservoir, and a second opening formed on another section of the cylinder that corresponds to the first volume portion, and wherein the supplementary conduit is connected to the second opening and the add-in cool fluid reservoir via the supplementary pump.

5. The cool fluid reservoir of claim 4, wherein the valve is moved to a second on position from the cut-off position to establish an outlet flow path from the second volume portion to the driver fluid reservoir via the first opening, a portion of the main conduit, and the bypass conduit, and wherein, in the second on position of the valve the supplementary pump pumps an add-in cool fluid from the add-in cool fluid reservoir into the first volume portion to:
   a) slidably drive the hollow piston along a second direction opposite to the first direction; and
   b) push a portion of the driver fluid from the second volume portion into the driver fluid reservoir via the outlet flow path.

6. The cool fluid reservoir of claim 1, further comprising a hollow tube disposed within the cylinder and connected to the one of the inlet or the outlet, wherein an end section of the hollow piston is disposed within the hollow tube and fluidically connected to the closed fluid loop via the hollow tube, and wherein the end section of the hollow piston slides relative to the hollow tube when the hollow piston is slidably driven by an add-in driver fluid or an add-in cool fluid.

7. The cool fluid reservoir of claim 1, wherein an end section of the hollow piston is directly connected to the closed fluid loop via a flexible hose, and wherein the end section of the hollow piston slides through the one of the inlet or the outlet when the hollow piston is slidably driven by an add-in driver fluid or an add-in cool fluid.

8. The cool fluid reservoir of claim 1, wherein the cool fluid is one of a mixture of water and propylene glycol with additives, a dielectric fluid, water, or 460-CCL100, wherein the driver fluid is one of a propylene glycol, a hydraulic fluid, water, or a mixture of water and propylene glycol, and wherein the operating pressure is a range from 10 pounds per square inch (psi) to 150 psi.

9. A coolant distribution unit (CDU) comprising:
   a closed fluid loop;
   a circulation pump connected to the closed fluid loop for pumping a cool fluid in the closed fluid loop; and
   a cool fluid reservoir disposed in a cool fluid flow path defined by the closed fluid loop, comprising:
      a cylinder having an internal volume defined between an inlet and an outlet, and a first opening;

a hollow piston slidably connected to the cylinder via one of the inlet or the outlet to split the internal volume into a first volume portion that is filled with the cool fluid and a second volume portion that is filled with a driver fluid; and a driver fluid assembly comprising a driver pump coupled to the cylinder via the first opening, wherein the first opening is formed on a section of the cylinder that corresponds to the second volume portion, wherein the first volume portion is fluidically connected to the closed fluid loop via the hollow piston and another one of the inlet or the outlet to allow a continuous flow of the cool fluid into the closed fluid loop via the cool fluid reservoir, wherein the driver pump pumps the driver fluid into the second volume portion via the first opening to slidably drive the hollow piston along a first direction to reduce the first volume portion and inject a portion of the cool fluid from the first volume portion into the closed fluid loop for managing loss of the cool fluid in the CDU based on an operating pressure of the cool fluid at a pump-inlet of the circulation pump.

10. The CDU of claim 9, wherein the driver fluid assembly further comprises a main conduit, a bypass conduit, a valve, and a driver fluid reservoir, wherein the main conduit is connected to the first opening and the driver fluid reservoir via the driver pump, wherein the valve is disposed between the driver pump and the first opening and connected to the main conduit, and wherein the bypass conduit is connected to the valve and the driver fluid reservoir.

11. The CDU of claim 10, wherein the valve is moved to a first on position from a cut-off position to establish an inlet flow path from the driver fluid reservoir to the second volume portion via the main conduit, the driver pump, and the first opening, and wherein, in the first on position of the valve, the driver pump pumps an add-in driver fluid from the driver fluid reservoir into the second volume portion via the inlet flow path to slidably drive the hollow piston along the first direction.

12. The CDU of claim 11, wherein the cool fluid reservoir further comprises a supplementary conduit, a supplementary pump connected to the supplementary conduit, an add-in cool fluid reservoir, and a second opening formed on another section of the cylinder that corresponds to the first volume portion, and wherein the supplementary conduit is connected to the second opening and the add-in cool fluid reservoir via the supplementary pump.

13. The CDU of claim 12, wherein the valve is moved to a second on position from the cut-off position to establish an outlet flow path from the second volume portion to the driver fluid reservoir via the first opening, a portion of the main conduit, and the bypass conduit, and wherein, in the second on position of the valve the supplementary pump pumps an add-in cool fluid from the add-in cool fluid reservoir into the first volume portion to:
a) slidably drive the hollow piston along a second direction opposite to the first direction; and
b) push a portion of the driver fluid from the second volume portion into the driver fluid reservoir via the outlet flow path.

14. The CDU of claim 12, further comprising a pressure sensor, a limit switch, and a controller, wherein the pressure sensor is disposed at the pump-inlet and communicatively coupled to the controller, wherein the limit switch is disposed on the cylinder and communicatively coupled to the controller, and wherein the controller is further communicatively coupled to the driver pump, the supplementary pump, and the valve.

15. The CDU of claim 14, wherein the controller, in response to determining that the operating pressure of the cool fluid at the pump-inlet is below a threshold pressure, generates a control signal to: a) move the valve to the first on position from the cut-off position and b) trigger the driver pump for pumping the add-in driver fluid from the driver fluid reservoir into the second volume portion via the inlet flow path.

16. The CDU of claim 14, wherein the controller, in response to detecting that a section of the hollow piston is proximate to a threshold position, generates a control signal to: a) move the valve to a second on position from the cut-off position and b) trigger the supplementary pump for pumping an add-in cool fluid from the add-in cool fluid reservoir into the first volume portion.

17. The CDU of claim 9, wherein the cool fluid is one of a mixture of water and propylene glycol with additives, a dielectric fluid, water, or 460-CCL100, wherein the driver fluid is one of a propylene glycol, a hydraulic fluid, water, or a mixture of water and propylene glycol, wherein the operating pressure is a range from 10 pounds per square inch (psi) to 150 psi, and wherein a threshold pressure is 5 psi.

18. The CDU of claim 9, wherein the cool fluid reservoir further comprises a hollow tube disposed within the cylinder and connected to the one of the inlet or the outlet, wherein a section of the hollow piston is disposed within the hollow tube and fluidically connected to the closed fluid loop via the hollow tube, and wherein the section of the hollow piston slides relative to the hollow tube when the hollow piston is slidably driven by an add-in driver fluid or an add-in cool fluid.

19. The CDU of claim 9, wherein a section of the hollow piston is directly connected to the closed fluid loop via a flexible hose, and wherein the section of the hollow piston slides through the one of the inlet or the outlet when the hollow piston is slidably driven by an add-in driver fluid or an add-in cool fluid.

20. A method comprising:
directing a flow of a cool fluid in a closed fluid loop of a coolant distribution unit (CDU) via a cool fluid reservoir comprising a cylinder having an internal volume defined between an inlet and an outlet, and a hollow piston slidably connected to the cylinder via one of the inlet or the outlet to split the internal volume into a first volume portion that is filled with the cool fluid and a second volume portion that is filled with a driver fluid,
wherein the first volume portion is fluidically connected to the closed fluid loop via the hollow piston and another one of the inlet or the outlet,
wherein the second volume portion is fluidically connected to a driver pump of a driver fluid assembly via an opening formed on a section of the cylinder that corresponds to the second volume portion of the cylinder such that the driver fluid assembly is fluidically connected to the second volume portion, wherein the driver pump pumps the driver fluid into the second volume portion via the opening, and
slidably driving the hollow piston by the driver fluid to reduce the first volume portion and inject a portion of the cool fluid from the first volume portion into the closed fluid loop for managing loss of the cool fluid in the CDU based on an operating pressure of the cool fluid in the closed fluid loop.

\* \* \* \* \*